United States Patent [19]

Glick

[11] 4,103,251

[45] Jul. 25, 1978

[54] STABILIZED DELAY LINE OSCILLATOR

[75] Inventor: Alvin L. Glick, Lexington, Mass.

[73] Assignee: The United States of America as represented by the Secretary of the Navy, Washington, D.C.

[21] Appl. No.: 793,984

[22] Filed: May 5, 1977

[51] Int. Cl.² .......................................... H03B 3/04
[52] U.S. Cl. .................................. 331/1 A; 307/208; 328/55; 331/135
[58] Field of Search .................. 328/55, 56, 135; 307/208; 331/1 A, 135, 136, 137

[56] References Cited

U.S. PATENT DOCUMENTS

| | | | |
|---|---|---|---|
| 2,835,807 | 5/1958 | Lubkin | 307/208 |
| 3,202,769 | 8/1965 | Coleman, Jr. | 328/55 |
| 3,337,800 | 8/1967 | Halley et al. | 328/56 |
| 3,418,498 | 12/1968 | Farley | 328/56 |
| 3,601,636 | 8/1971 | Marsh, Jr. | 307/208 |
| 3,631,266 | 12/1971 | Kassabgi | 307/208 |
| 3,793,591 | 2/1974 | Trinca | 307/208 |
| 3,831,096 | 8/1974 | Brown, Jr. | 328/55 |
| 4,051,390 | 9/1977 | Reeves | 328/55 |

OTHER PUBLICATIONS

IBM Tech. Discl. Bul., "Variable Digital Delay Line", W. E. Connors, vol. 8, No. 4, Sep. 1965.

Primary Examiner—John Kominski
Attorney, Agent, or Firm—Richard S. Sciascia; George A. Montanye

[57] ABSTRACT

A device and technique for providing stability to a coherent delay line clock. A voltage controllable delay is combined with the lumped delay line of a coherent delay line clock to enable the control of the period of the clock. The voltage controllable delay is obtained by comparing the clock count during a predetermined time period against a fixed number N to obtain a difference count. The difference count is then integrated to form a bias voltage for control of the additional delay. The delay line period will then be a ratio of the predetermined period to the fixed number N, which number may be digitally modified to provide a source of variable frequency.

14 Claims, 11 Drawing Figures

FIG. 1b GATE

FIG. 1c DELAY LINE IN

FIG. 1d DELAY LINE OUT

FIG. 2b GATE

FIG. 2c DELAY LINE IN

FIG. 2d DELAY LINE OUT

FIG. 2e ONE SHOT

STABILIZED DELAY LINE OSCILLATOR

BACKGROUND OF THE INVENTION

The present invention relates to timing clocks and more particularly to an improved technique for providing long term stability to delay line clocks.

Generally, delay line clocks are utilized in systems wherein it is desired to produce an output timing pulse which is coherently related to the time of initiation of the delay line clock. In particular, in distance measuring systems, such as radar systems, it is necessary to measure time intervals beween a pulse transmission and target echo in order to determine particular target characteristics. The rate at which the pulses are generated is known as the pulse repetition frequency (PRF) and it is to this rate that the receiving system must be synchronized in order that such characteristics as target range may be accurately measured. While delay line clocks are capable of providing requisite timing waveforms capable of being synchronized to the pulse repetition frequency, the same are susceptible to instabilities when operated for long periods of time. If the radar transmitter were constrained to transmit at an exact instant of time, an incoherent crystal clock could provide the necessary timing in relation to the pulse repetition frequency. However, where it is desired to operate the transmitter asynchronously, there are presently no techniques which enable the accuracy of the crystal oscillator to be utilized as a timing waveform. While various other techniques have been proposed to provide the necessary correlation, the same utilize complex equipment which has been burdensome in cost and system performance. There is therefore a continuing need for clock synchronizing circuitry which would enable the use of the less complex and less costly delay line clock while still providing the necessary long term stability for more versatile operation in current radar systems.

Accordingly, the present invention has been developed to overcome the specific shortcomings of the above-known and similar techniques and to provide a circuit for allowing frequency corrections to a delay line clock on a sampled basis.

SUMMARY OF THE INVENTION

It is therefore an object of the present invention to provide timing circuitry which will adapt to changes in frequency.

Another object of the invention is to provide a delay line clock which will maintain accuracy on a pulse to pulse basis.

In order to accomplish the above and other objects, a variable voltage delay is coupled to the output of a lumped delay line in a delay line clock. The variable delay s provided by a voltage controllable one-shot multivibrator which is gated to the input of the delay line. The output of the multivibrator is thereafter controlled by a variable voltage produced by comparing the delay line clock count against a fixed number N during a predetermined reference period. The control voltage will act to adjust the output of the multivibrator such that the delay line clock output has a frequency equal to the reference period divided by the constant N. The delay line clock output is therefore stabilized with respect to the reference period on a pulse to pulse basis and can be adjusted in frequency by digitally modifying the fixed number N. Since the circuitry provides correction to the frequency on a sampled basis, the accuracy of an incoherent crystal oscillator can be employed to produce coherent timing pulses in systems operated asynchronously.

Other objects, advantages and novel features of the invention will become apparent from the follwoing detailed description when considered with the accompanying drawings wherein:

BRIEF DESCRIPTION OF THE DRAWINGS

FIGS. 1a–1d represent a schematic diagram of a typical delay line clock and its operation known in the prior art.

FIGS. 2a–2e represent a schematic diagram of a stabilized delay line clock and its operation in accordance with the present invention.

DETAILED DESCRIPTION OF A PREFERRED EMBODIMENT

Figure 1A:
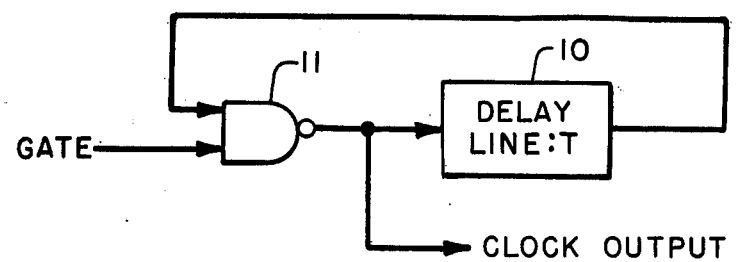
Figure 1A:
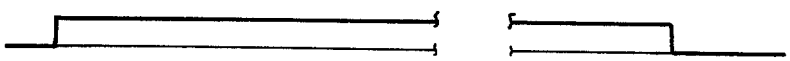
Figure 1A:
Figure 1A:
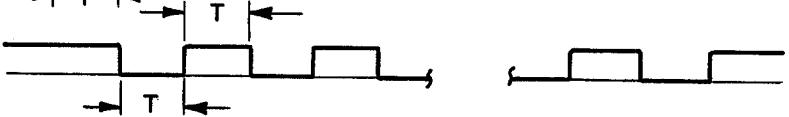

Referring now to FIG. 1, there is shown a typical configuration of a delay line clock as is known in the prior art wherein like numerals refer to like elements throughout the drawings. The delay line clock is generally a timing device which may be initiated independently by a gate signal but which will maintain accuracy with respect to the gating time. As can be seen from FIG. 1a, the clock consists of a delay line 10 having its output coupled as one input to a NAND-gate 11. The output of the NAND-gate is in turn coupled to the input of the delay line to form a closed loop where the clock output is taken as the signal output from NAND-gate 11. The delay line 10 may be of any conventional construction such as a tapped LC lumped constant integrated circuit type which provides an output delayed by a fixed time T after a signal input to the delay line. When the two basic signal levels are represented as either high or low, the circuit of FIG. 1a, in its operative state, will have a low gate input to the NAND-gate 11 and a high input from the output of the delay line 10 such that the output clock signal has a steady high level. When a high input (FIG. 1b) is thereafter applied to the gate input of 11, however, the output of NAND-gate 11 will go low (FIG. 1c) in response to the leading edge of the signal. After the preset delay time T, the output of the delay line 10 will go low (FIG. 1d) thereby causing the NAND-gate output to go high. At this point, the alternating high/low cycle output of the NAND-gate 11 will repeat itself to provide a continuing alternating waveform having a period of 2 T as long as the gate input to 11 remains high. The output waveform therefore provides a timing clock output which is initiated independently by the gate input 11 but which remains accurately synchronized with the starting time.

While the above configuration produces a coherent timing output, the delay line is subject to variations in the timing period during its course of operation which results in inaccuracies in the timing output over long periods of time. Accordingly, the present invention acts to overcome this instability by providing a highly stable reference (for example, an incoherent crystal clock) which will cooperate to produce a modification in the output of the delay line clock to stabilize the period of the clock output at a selected value. The modification is made by inserting the equivalent of a voltage controlled delay in series with the lump delay line 10. This delay is provided by a voltage controllable one-shot multivibrator having its output connected as an additional input to the NAND-gate 11 and its input coupled to respond to the leading edge of a high output from the NAND-gate. In the present instance, the leading edge of the pulse changing from low to high will cause the one-shot multivibrator (having a normally high level output) to provide a low output pulse having a width equal to $\Delta T$ as determined by the voltage input V. The clock output can then be taken from the NAND-gate 11 and optionally coupled through a second NAND-gate 13 to be used as a timing clock output waveform.

Figure 2A:
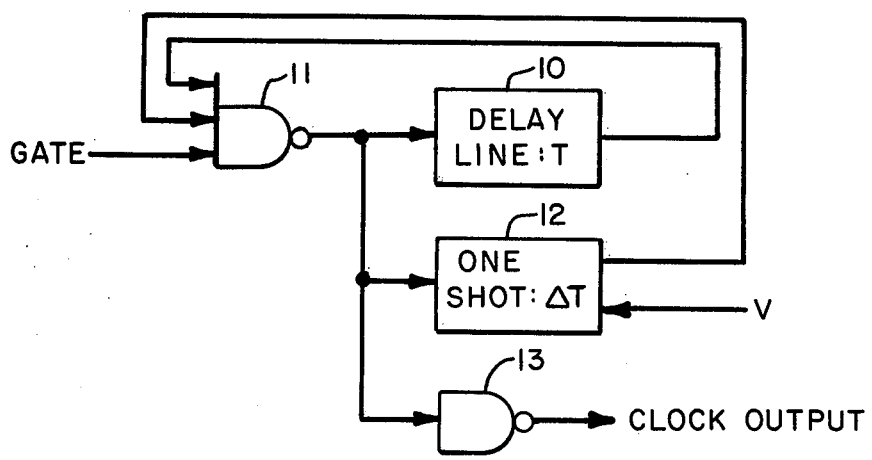
Figure 2A:
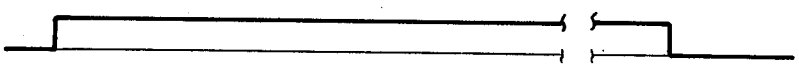
Figure 2A:
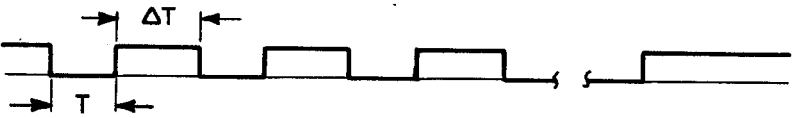
Figure 2A:
Figure 2A:

Referring now to FIGS. 2b–2e, the waveform outputs of each of the elements will be described for a normal operation of the circuit. In its initial state, the gate input of NAND-gate 11 is low, the output of the delay line 10 is high, and the output of the one-shot multivibrator is high. The output from the NAND-gate 11 is therefore in the high state. When a high gating pulse is applied at the gate input to NAND-gate 11 (FIG. 2b), the NAND-gate output responds to the leading edge and goes low (FIG. 2c). After the fixed time period T of the delay line, the output of the delay line goes low (FIG. 2d) producing a low input to the NAND-gate 11 and causing the output of the NAND-gate to go high (FIG. 2c). In response to the leading edge of the high output from the NAND-gate, the multivibrator 12 changes its output from high to low (FIG. 2e). Again, after the time period T has passed, the output of the delay line will go high (FIG. 2d). However, as long as the output of the one-shot 12 remains low (for a time $\Delta T$ as determined by bias V), the output from the NAND-gate will stay high. After the output from 12 goes high (FIG. 2e), the cycle will repeat itself as shown in FIGS. 2c and 2d. Thus, the period of the waveform output from NAND-gate 11 (FIG. 2c) will depend on the delay added by the oneshot multivibrator 12 which can be separately adjusted to compensate for any changes in stability by simple alteration of the voltage V.

Figure 3:
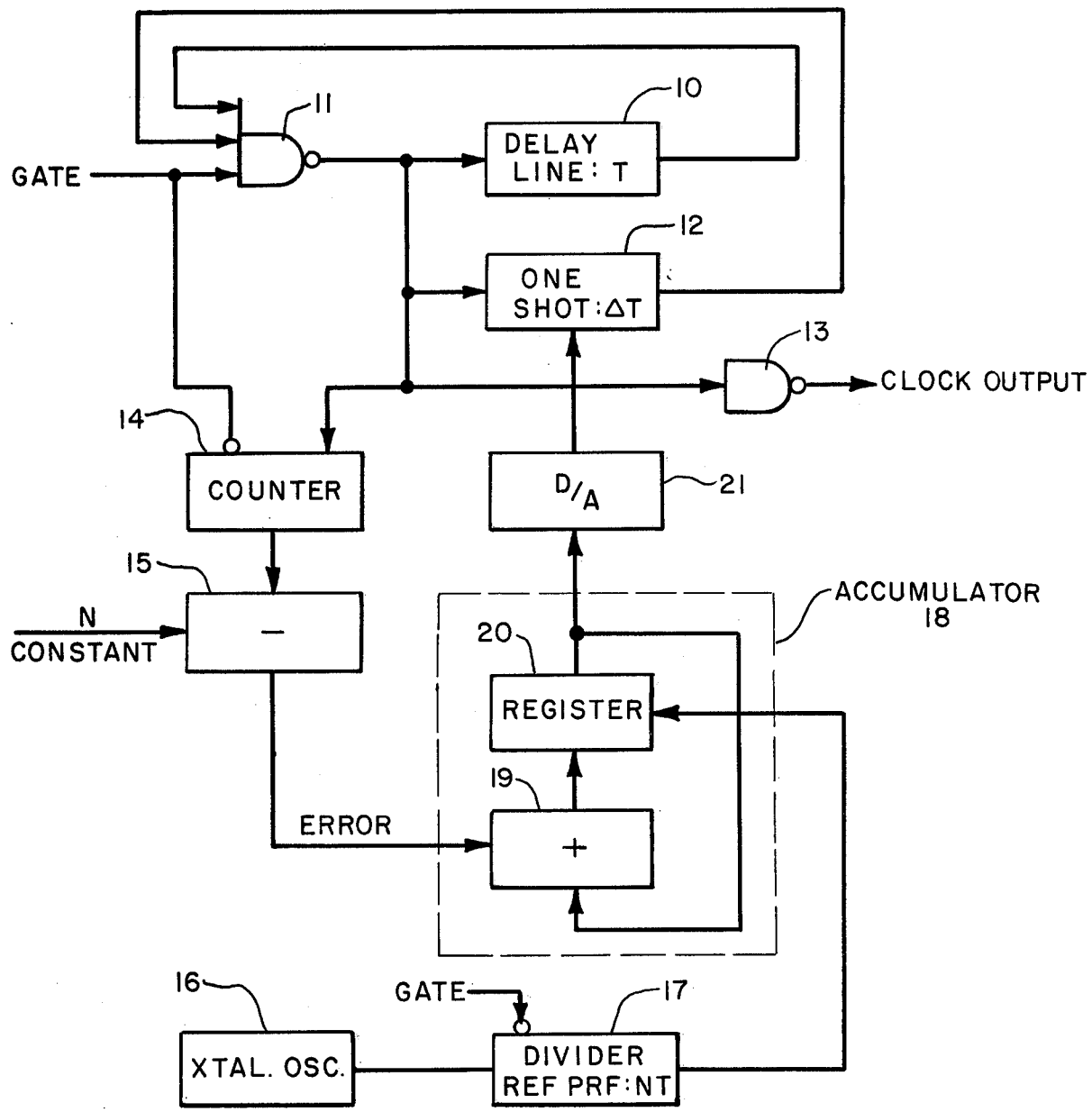
FIG. 3 is a schematic diagram showing the circuit for providing the variable voltage in FIG. 2.

In accordance with the inventive technique, the stability of the delay line clock output from 13 is provided, for example, by deriving a control voltage using the inherent stability of an incoherent crystal oscillator as shown by FIG. 3. In this embodiment, the output from NAND-gate 11 is coupled as in input to the digital counter 14 which counts the delay line clock output during a precise period, the reference period, as will be subsequently described. The count is initiated upon receipt of the leading edge of the high gate pulse from the gate input to NAND-gate 11 and continues until the counter is reset (the counter 14 and divider 17 are held in the reset position by a low level pulse signal). The digital output from the counter 14 is coupled to a subtractor 15 such that a digital constant N, provided as the second input to subtractor 15, is subtracted from the digital count. The output from the subtractor (in the form of a digital ramp) is then provided as an input to the accumulator 18.

The accumulator 18 consists of the combination of a summing circuit 19 and register 20. The summing circuit 19 has one input coupled to receive the digital value from the output of 15 and has its output coupled to register 20. The output of register 20 is in turn coupled to a digital to analog converter 21 and as feedback to the second input of the summer 19. The register 20 is conventionally constructed such that it stores the sampled output of 19 that was present at the time of the previous clock pulse and outputs this value until the next clock pulse arrives. The output of the summer 19 is therefore the sum of the output of register 20 and the sampled output of subtractor 15. Clocking of the accumulator 18 can be provided in either of two ways. In the case where the PRF is independently stable, it can be used to clock the accumulator 18 directly as well as resetting the counter 14 via the gate signal. For this case, the reference period ($T_r$) is the PRF period. If, on the other hand, the PRF is unstable as in the case of a radar with a programmable PRF, an alternate reference period is generated as in FIG. 3. Here the clocking is controlled by a pulse provided from the output of a circuit consisting of a crystal oscillator 16 and divider 17. Crystal oscillator 16 provides a stable waveform which is counted in divider 17 to produce an output pulse at $T_r$ which is less than the shortest PRF period expected. The period of the delay line oscillator is to be forced to satisfy the relation $T_r = NT$. For this case the divider is reset by a low pulse from the gate input and initiates its dividing function upon receipt of the leading edge of a high gate pulse. After $T_r$ the divider provides an output signal to clock the register 20. When the output from 17 clocks register 20, the output from the register is updated. Register 20 is coupled to a digital to analog converter 21 to produce an analog voltage which controls the width of the output pulse provided by the multivibrator and therefore the period of the delay line clock.

As can be seen from the above, the control voltage is developed by accumulating a digital error signal with reference to a precise period. The precise period is the PRF period, or $T_r$, which is measured by an external reference, in this case the incoherent crystal oscillator 16 coupled to divider circuit 17. Thus, upon receipt of a high gate pulse, the counter 14 and divider 17 are initiated and the delay line clock is counted during the reference period. The resultant count is continuously compared to the fixed number N to produce a difference count at the output of 15 in the form of a ramp starting a value of $-N$. The difference count is provided as input to the accumulator 18 and is represented as a ramp during each reference period which starts at $-N$ and reaches a value close to 0 at the time the divider 17 provides a pulse representing the reference period. At this time, the accumulator 18 is clocked by the coupling from 17 to register 20 and the value in the register 20 is updated. If the ramp amplitude at the sampling time is different from zero, the value provided to the D/A converter 21 is modified to vary the voltage of a one-shot multivibrator 12. The delay line period is thus forced to be the ratio of the $T_r$ and the fixed number N to produce a frequency at the clock output equal to ($T_r/N$) where N can be digitally modified to provide a source of variable frequency. The clock pulses are coherent in that they can be maintained accurately with respect to the starting time in spite of independent initiation.

Figure 4:
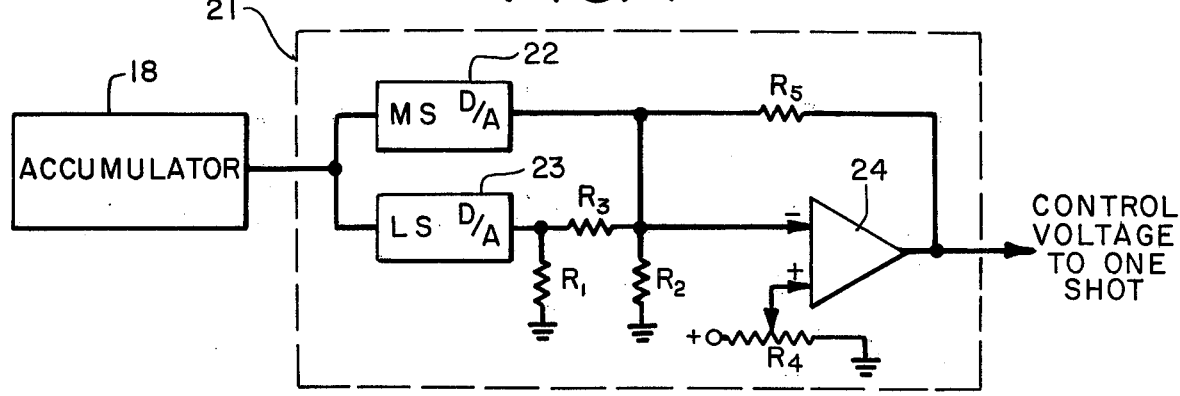
FIG. 4 illustrates a typical embodiment of a digital to analog converter that may be used in the circuit of FIG. 3.

In order for the closed loop operation to be stable, it is necessary that the change in frequency due to an $m$ bit change in the D/A input produce a number at the end of the difference ramp output from 15 which is less than $-m$ bits. This can be easily accomplished using a circuit of the type shown in FIG 4. In this instance, the digital output of a 16 bit accumulator is coupled such that the 8 most significant bits (MSB) are provided as input to one D/A converter 22. The 8 least significant bits (LSB) are likewise coupled to a similar D/A converter 23. The output from 23 is coupled to ground through resistor $R_1$ and thereafter through resistor $R_3$ to the negative input of operational amplifier 24. The output from 22 is in turn coupled to the negative input of the operational amplifier 24, through resistor $R_2$ to ground, and through resistor $R_5$ to the output of operational amplifier 24. The operational amplifier 24 is biased for low gain operation through variable resistor $R_4$ having the voltage output applied to the positive input of the operational amplifier. The resulting output from the operational amplifier 24 is the control voltage V which determines the width of the low state signal pulse from one-shot 12 and controls the period of the delay line clock. Using the circuit of FIG. 4, the operating point of the D/A converter adjusts to that analog voltage which will give N cycles in the reference period. In particular, the circuit of FIG. 4 effectively provides double the number of bits for frequency control than would be normally obtained with only a single D/A converter by adding the current of the LS D/A converter by shunt to the MS D/A converter.

As can be seen from the above description, the present invention provides an effective technique for stabilizing a delay line clock to produce a frequency synchronized with any desired PRF period. The resultant waveform will be stable on a sampled basis and provide increases accuracy for the delay line clock over long term operation. The present technique accomplishes such benefits with only a simple modification to conventional delay line clock circuitry using inexpensive elements and the inherent stability of a crystal oscillator. In operation, the stabilized delay line clock provides distinct advantages in such systems as radar systems, where asynchronous operation requires that timing pulses by accurately produced in response to the transmission of the radar pulse. Using the above-noted circuit, timing pulses for ranging of a target echo pulse can be easily and inexpensively generated thereby reducing the complexity of the system while improving operational versatility. All of these are advantages not recognized by the prior art as previously described.

While the invention has been described with reference to particular arrangements of elements, it should be recognized that any other configuration could be used which is capable of providing the desired control voltage and stability consistent with the present teachings. Obviously, many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A stabilized pulse generating circuit comprising:
    a delay line clock constructed to provide a repetitive alternating waveform clock output in response to an input signal; and
    means coupled to said delay line clock for compensating for changes in the delay line timing period of the clock in order to stabilize the period of the clock output at a selected value.

2. The circuit of claim 1 wherein said means for compensating comprises means for comparing the output of said delay line clock against a fixed number N during a reference period ($T_r$) and providing a signal to control said clock period such that the output of the clock is stabilized at a frequency equal to ($T_r/N$).

3. The circuit of claim 1 wherein said delay line clock comprises,
    a delay line having an input and output,
    gating means having a plurality of inputs and an output coupled to the input of said delay line for providing a pulse input to said delay line, the output of the delay line being coupled to one of the inputs to said gating means, and
    means for providing a gating pulse to one of the other inputs of the gating means to provide said input signal for initiating the repetitive alternating waveform clock output.

4. The circuit of claim 3 wherein said means for compensating comprises,
    means responsive to the output of said gating means for providing a variable width pulse to another of the inputs to said gating means, and
    means operable to said means for providing a variable width pulse for controlling the width of said pulse.

5. The circuit of claim 3 wherein said gating means comprises a NAND-gate and wherein said means for compensating comprises,
    a one-shot multivibrator having an input coupled to the NAND-gate output and an output coupled to provide a variable width pulse to another one of the NAND-gate inputs, and
    a variable voltage source coupled to control the width of the pulse output of the one-shot multivibrator.

6. A stabilized pulse generating circuit comprising:
    a delay line clock constructed to provide a clock output frequency including,
        a delay line having an input and output,
        gating means having a plurality of inputs and an output coupled to the input of said delay line for providing a pulse input to said delay line, the output of the delay line being coupled to one of the inputs to said gating means, and
    means for providing a gating pulse to one of the other inputs of the gating means to initiate the clock output; and means coupled to said delay line clock for stabilizing the period of the clock output including,
        means responsive to the output of said gating means for providing a variable width pulse to another of the inputs to said gating means, and
        means coupled to said means for providing a variable width pulse for controlling the width of said pulse including,
        means for providing a series of pulses separated in time by a precise reference period,
        counter means coupled to the output of said gating means and responsive to a gating pulse for counting the output pulses from said gating means during said reference period to provide a count output,
        means for comparing the count output against a fixed number N and providing a difference output,
        accumulator means responsive to said reference period pulses for storing the difference output at the time a reference pulse is received, and
        converter means coupled to the accumulator means for changing the output of the accumulator to a signal for controlling the width of said variable width pulse.

7. The circuit of claim 6 wherein said means for providing the reference period pulses comprises a source of radar PRF pulses having an independently stable PRF period.

8. The circuit of claim 6 wherein said accumulator means comprises,
- a summing circuit having a first and second input and an output, and
- a storage register having an input coupled to store the output of the summing circuit upon receipt of a first reference period pulse and provide this output as input to said converter means until receipt of the next succeeding reference period pulse,
- said summing circuit having its first input coupled to recieve said difference output and its second input coupled to receive the output of said storage register.

9. The circuit of claim 6 wherein said means for providing reference period pulses comprises,
- a crystal oscillator,
- a divider coupled to said oscillator and responsive to a gating pulse for providing a reference period output pulse at a time equal to NT after receipt of the gating pulse where T is the delay time of the delay line.

10. The circuit of claim 9 wherein the means for counting and the divider are coupled to receive the same gating pulse to initiate counting and division.

11. The circuit of claim 9 wherein said counter means is a digital counter, said means for comparing is a subtractor coupled to subtract the number N from the count output, and said converter means is a digital to analog converter.

12. The circuit of claim 11 further including means for digitally modifying N to change the delay line clock output frequency.

13. The circuit of claim 11 wherein said means for providing a variable width pulse comprises a one-shot multivibrator having an input coupled to the output of the gating means and an output coupled to provide a variable width pulse to said another of the inputs to said gating means, said multivibrator having a control input coupled to the analog voltage output of said digital to analog converter for changing the width of the multivibrator output pulse in response to the analog voltage.

14. The circuit of claim 13 wherein said gating means comprises a NAND-gate.

* * * * *